United States Patent [19]

Niehaus

[11] 4,301,188
[45] Nov. 17, 1981

[54] PROCESS FOR PRODUCING CONTACT TO GaAs ACTIVE REGION

[75] Inventor: William C. Niehaus, New Providence, N.J.

[73] Assignee: Bell Telephone Laboratories, Incorporated, Murray Hill, N.J.

[21] Appl. No.: 80,205

[22] Filed: Oct. 1, 1979

[51] Int. Cl.$^3$ .......................................... H01L 21/283
[52] U.S. Cl. ..................................... 427/88; 29/571;
357/67; 427/89; 427/383.3
[58] Field of Search ........................ 427/89, 88, 383.3;
357/67; 29/571

[56] References Cited

U.S. PATENT DOCUMENTS

| | | | |
|---|---|---|---|
| 3,890,699 | 6/1975 | Vilms | 357/67 |
| 3,914,785 | 10/1975 | Ketchow | 357/67 |
| 3,959,522 | 5/1976 | Ladany | 357/67 |
| 3,981,073 | 9/1976 | Dully | 357/67 |
| 4,011,583 | 3/1977 | Levinstein | 357/67 |
| 4,179,533 | 12/1979 | Christou et al. | 427/89 |
| 4,179,534 | 12/1979 | Chang et al. | 427/89 |
| 4,186,410 | 1/1980 | Cho et al. | 357/67 |

OTHER PUBLICATIONS

Anderson et al., "Smooth and Continuous Ohmic Contacts to GaAs Using Epitaxial Films", J. Appl. Phys. 40(5), May 1978, pp. 2998-3000.
Ho et al., "Stable Junctions Between GaAs . . . ", IBM TDB, 21, No. 4, p. 1753, Sep. 1978.
Ho et al., "Stable Junctions . . . As a Diffusion Barrier", IBM TDB, 21, No. 4, Sep. 1978, p. 1752.
Jung, "Binary Ag-IN Ohmic Contacts to GaAs and GaSb", Electron Technology, 8, 1, pp. 63-64, (1975).
Wemple et al., "Source-drain Burn-out in GaAs MES-FETS", Inst. Phys. Conf. Ser. No. 33b© 1977, pp. 262-270.
Niehaus et al., "GaAs Power MESFETS", Inst. Phys. Conf. Ser. No. 33b© 1977, pp. 271-280.

Primary Examiner—John D. Smith
Attorney, Agent, or Firm—Bruce S. Schneider

[57] ABSTRACT

The stability of semiconductor devices such as gallium arsenide field effect transistors are significantly improved by controlling the process leading to the production of the drain contact. The process requires that the annealing of metals used to form the contact to gallium arsenide is done under conditions which prevent the excessive formation of metal dendrites penetrating into the gallium arsenide active region.

6 Claims, 5 Drawing Figures

PROCESS FOR PRODUCING CONTACT TO GaAs ACTIVE REGION

BACKGROUND OF THE INVENTION

1. Field of the Invention

This invention relates to semiconductor device fabrication and, more particularly, to the production of electrical contacts to semiconductor materials.

2. Art Background

Essentially all semiconductor devices and particularly those intended for operation at high frequency, e.g., microwave frequencies, require a low resistance (specific contact resistance typically less than $10^{-4}$ ohm/cm$^2$) electric contact to the active portions of the device. Often the method used to form the contact significantly affects the performance and reliability of the device, i.e., the percentage of devices found unacceptable after fabrication and the lifetime of the acceptable devices. For example, in the case of GaAs field effect transistors (FETs) various short-term device failure mechanisms have been associated with the contacts made to the GaAs active region. (See for example, Wemple & Niehaus, *Source Drain Burn Out in GaAs MES FETS*, "Gallium Arsenide and Related Compounds" (St. Louis) 1976, *Institute of Physics Conference Series*, 33b, 226.) Some expedients have been developed to decrease device failure induced by contact formation. In the example of GaAs FETs, N+ GaAs pads at the source and drain (as shown in FIG. 1) have been added to increase stability properties. (See 1976 *Conference Series, supra*, Vol. 33b, 271.)

Data on long-term stability is scarce for many devices such as power FETs. However, for many semiconductor devices, improvements such as indicated above have been reported as successful as improving short-term stability. In the case of GaAs FETs, tests have indicated a 12 volt burnout voltage for a device without N+ pads compared to a greater than 20 volt burnout voltage for a device with the N+ pads present. Despite these advances, further increase in both short- and long-term device stability and thus reliability are desirable. Additionally, when the stability of device is increased, generally the reject percentage in a fabrication line is similarly decreased. Thus, not only equipment failure, but also equipment cost is reduced by advances in the production of stable devices.

SUMMARY OF THE INVENTION

The invention involves the realization that dendrites formed during contact processing degrade both long- and short-term stability. The technique for producing contacts to GaAs in the semiconductor device, e.g., depositing metal layers such as Au, Ag, and Au/Ge alloys onto the GaAs followed by an annealing of these layers in an inert or reducing atmosphere, is controlled so that dendrite formation is limited and comparatively better stability is achieved. This control is achievable, for example, by choosing processing conditions, e.g., annealing temperature and the composition of the contact, to restrict the formation of metallic dendrites.

DETAILED DESCRIPTION

As described earlier, GaAs FETs advantageously employ an N+ (majority carrier concentration greater than that of the GaAs active region) GaAs surface layer. This N+ surface layer is typically deposited on a GaAs region (carrier concentration generally in the range $3 \times 10^{16}$ to $3 \times 10^{17}$ carriers/cm$^3$) which was, in turn, deposited on a semi-insulating GaAs buffer layer, 2, in FIGS. 1 and 2. The metal contacts are then made to this N+ layer, and the layer is selectively removed by conventional lithographic and etching techniques so as to form the N+ pad, 8, in FIG. 1, at the position desired for the source and drain. (See Niehaus et al supra.) By insuring that metal dendrites do not emerge from these N+ pads into the GaAs active region, long- and short-term stability is advantageously enhanced. Although the invention is described with reference to this preferred embodiment, it should be noted that the limitation of dendritic formation is significant for short-term stability even if such pads are not N+, i.e., their carrier concentration is not higher than the GaAs active region. In this latter context, it is difficult in purely a physical context to perceive where the pad ends and the active region begins since their carrier concentrations may be identical. For purposes of this invention, the pad height, 25 in FIG. 2, is the height of the semiconductor area extending above the height of the active channel, 26, in the input or output region. To illustrate this concept, the pad is delineated by an imaginary dotted line, 22, in FIG. 2. The pad height for the N+ situation is defined as the height, 24, of the N+ region, 8, in FIG. 1. (Similarly, the active layer is that region extending between the buffer region, 2, and an imaginary line coincident with dotted line 22 or solid line 27 in FIGS. 2 and 1, respectively.)

As discussed, successive metal layers are deposited on an N+ or N semiconductor layer and then the contact is produced by heating--annealing. This annealing allows the formation of metal eutectics such as Au/Ge/GaAs which are necessary for the desired electrical contact properties. However, the formation of metal eutectics through heating also produces other interaction between the metals and the GaAs.

Figure 1:
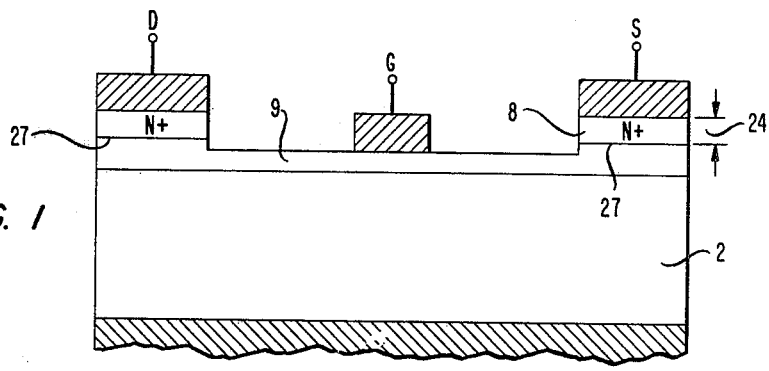
FIGS. 1 and 2 illustrate possible device configurations produced in the subject invention.
Figure 2:
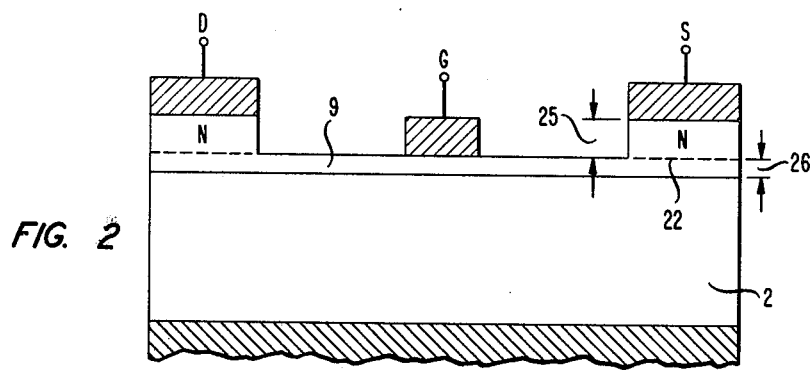
Figure 3:
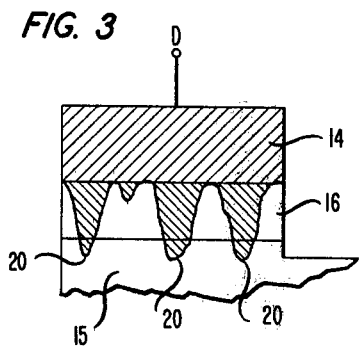
FIGS. 3, 4, and 5 illustrate possible contact formations.
Figure 4:
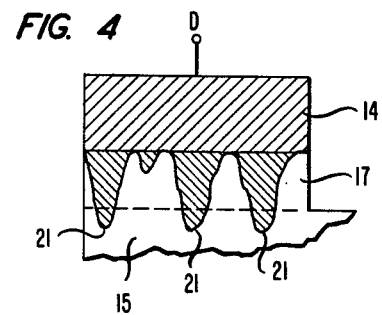
Figure 5:
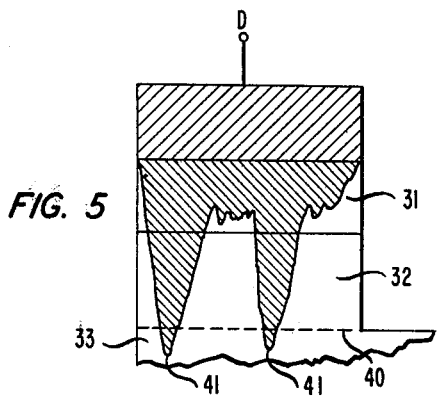

It has now been realized that this process, if not carefully controlled, produces dendrites such as shown in FIGS. 3 and 4 (expanded views of the GaAs active region/contact interfaces of FIGS. 1 and 2, respectively, where 14 is the metal used as contact in each case, 15 is the GaAs active region, and 16 and 17 are the N+ and N pads, respectively. Dendrites that extend through the N+ pad, as defined previously, into the active GaAs region as shown as 20 in FIG. 3 induce excessively high current densities that, in turn, lead to breakdown of the device itself. Alternatively, if a pad is used but this pad is not N+, dendrites penetrating through the pad into the GaAs active region as shown as 21 in FIG. 4 induce short-term failure. Similarly, if a device is made having both an N and N+ region of the pad as shown in FIG. 5, where 31 is an N+ region, 32 is an N region, and 33 is the active region, short-term stability is enhanced if the contact process is controlled so that dendrites, 41, which penetrate into the active region (delineated as the area below imaginary dotted line 40) ae avoided. Thus, the invention involves the control of the process used to produce the contacts so that dendrites do not extend into the GaAs active region. (It should be noted that the effect of dendrite formation at the drain is more critical than at the source contact. Thus although it is somewhat advantageous to control dendrite formation at the source, it is not essential. The control specified is most important for the drain contact.)

Various parameters are controllable to restrict the formation of dendrites. For example, it is possible to adjust the annealing temperature, the time of annealing, and the composition of the metallic body deposited on the pad. The temperature used and the time the device is subjected to this temperature strongly influence the magnitude of the dendrites formed. As previously discussed, dendrites larger than the thickness of the pad must be avoided. For typical pad thicknesses, i.e., thicknesses in the range 0.3 $\mu$m to 0.5 $\mu$m, temperatures in the range 400 degrees C. to 450 degrees C., preferably 400 degrees C. to 420 degrees C., are applied for typically 10 to 15 seconds. Naturally, if thicker or thinner pads are utilized, the temperature and time periods must be adjusted appropriately. This adjustment is advantageously made by employing a controlled sample. A contact is made using a proposed temperature and annealing time. The device is mounted, for example, by impressing it in wax with the contact side down. The GaAs substrate is chemically etched away by an etch which does not affect the contact metals, e.g., $H_3PO_4$:$H_2O_2$: $H_2O$ in the ratios 3:1:1 to reveal the morphology of the metallic contact thus produced. The size of the dendrites is then measured using a scanning electron microscope. If the dendrites are deeper than the desired pad thickness, the temperature and the processing time is reduced until a suitable result is achieved. However, it should be noted that temperatures below about 400 degrees C. are generally not useful since inadequate metal/GaAs eutectic formation occurs and an unsuitable contact is generally obtained.

The metal used as the contact is deposited by conventional techniques such as by evaporation from a suitable metal charge in a resistively heated boat. (See Maissel & Glang, *Handbook of Thin Film Technology*, McGraw-Hill, 1970.) As previously discussed, the composition of the metals used to form the contact also influences dendrite formation. It is possible to adjust the composition of the contact so that dendrite depth is controlled. However, other requirements restrict the allowable range of this adjustment. Obviously, the composition must be adequate to form a low resistance, less than $10^{-4}$ ohm-cm, contact. Also, it has been previously found that suitable contact to GaAs must include a sufficient portion of a metal that prevents balling at the metal layer surface. Typical metals useful in preventing balling are elements such as Ag and Ni. (See G. Y. Robinson, *Solid State Electronics*, 18, 331 (1975).) Further, this metal that prevents balling i.e, insures a smooth surface, usually should not be in an excessive amount as compared to the quantity of Au used in the contact. Typically, ratios of less than 1:1 Ag to Au are advantageously employed to insure that subsequent chemical processing steps do not attack the metal contact. Further, deposition of the Ag directly on the GaAs produces a rectifying contact for annealing temperatures less than 450 degrees C., i.e., a finished contact having a blocking voltage greater than 1.6 volts and is thus not preferred.

In addition to this Ag layer, Au and an n-type dopant such as Ge must be present. The Au and Ge together form an eutectic with GaAs. It is possible to introduce the Au and the n dopant initial before annealing either as a single composite layer or in separate layers. Typically, to satisfy these combined requirements, the material to prevent balling, e.g., the Ag layer is sandwiched between layers of Au and the Au/n dopant composition to insure that balling is avoided and that a nonblocking contact is formed.

In one embodiment, a Ge/Au alloy is deposited directly onto the GaAs, an Ag layer is deposited on this Ge/Au film, and then a layer of Au is deposited upon the Ag. This order of deposition insures that the Ag is present to prevent balling but does not interfere with the formation of a low resistance contact. Other metal deposition compositions, however, are also possible. For example, it has been found that Ge will easily diffuse through Ag and Au. Therefore, a metal deposition order, for example, of 1250 Å Au, 1000 Å Ag, and 400 Å of Au/Ge composition when annealed also produces an acceptable contact with a surface having dendrites of about 0.1 $\mu$m in depth.

Less deep dendrites are formed when less Au is contained in the layer initially deposited on the pad semiconductor. For example, when three devices are made having respectively 100 Å, 250 Å, or 500 Å of Au followed by 1000 Å of Ag 400 Å of an alloy evaporated from an 88% Au-12% Ge by weight mixture and a 1000 Å Au layer, the smallest dendrite formation is achieved in the former case. Thus, at least when Ge diffusion through the Ag layer is relied upon, the amount of Au in the layer contacting the GaAs should be limited. Similarly, dendrite depth is reduced when the amount of Ge reaching the GaAs is reduced. For example, when two devices having respectively 400 Å of an Au/Ge composition or 10 Å of such composition are deposited on the pad semiconductor followed by a 1000 Å of Ag and 1250 Å of Au, the latter exhibits a surface with smaller dendrites. As with annealing temperature, an optimum composition is determined by using a control sample to adjust dendrite depth for a given GaAs pad thickness.

The temperature used for the annealing process affects the dendrite size obtained with any particular metal composition. The examples given assume an annealing temperature of 420 degrees C. Changes of temperature will produce different results, and a controlled sample, as detailed above, is used to determine the optimum composition used for a given temperature. However, for typical contact compositions, temperatures above 450 degrees C. for use with pads of average thickness, are not acceptable since dendrites generally penetrate into the active region. Similarly, temperatures below 400 degrees C. are typically not useful for GaAs devices since adequate contacts are not obtained.

The following examples are illustrative of typical processing conditions and the results obtained. Examples 2 and 7 producing dendrites which penetrate the active layer of the device have been inserted for comparison.

EXAMPLE 1

To produce the substrate which is to be contacted, the fabrication procedure described in Niehaus et al supra is followed up to and including the point where an N+ GaAs layer is deposited on the N GaAs active region. This N+ layer was 0.2 $\mu$m thick. Mesas are formed and a pattern for the source and drain is delineated using a standard lithographic technique both as further described in the Niehaus paper. A 30% hydrogen peroxide solution with a pH adjusted to 7.2 using ammonium hydroxide was sprayed at the delineated substrate for a period of 10 seconds. It was then rinsed in distilled water and blown dry. This delineated substrate was then placed in a sample holder of a conventional evaporation apparatus. Three boats were placed in the evaporation apparatus respectively containing (1) a composition by weight of 12% of 99.999% pure Ge and 88% of 99.999% pure Au; (2) 99.999% pure Ag; and (3) 99.999% pure Au. The apparatus was then evacuated to $2 \times 10^{-7}$ Torr. Two boats were left at room temperature, and the first boat (as enumerated above) was resistively heaed to a temperature which produces an evaporation rate of approximately 6 Å/sec. This rate of evaporation was measured by a standard quartz crystal thickness monitor. The evaporation from boat 1 was continued until 400 Å of Au/Ge was deposited. The first boat was then cooled, and the second boat was heated to a temperature to achieve the same evaporation rate. This process was continued until a Ag layer thickness of 1000 Å was achieved. This boat was then cooled and the third boat was heated to achieve a similar evaporation rate. This evaporation was continued until 1250 Å of Au was deposited. The system was then vented and the sample removed.

The resist used in the lithographic method along with the metals deposited on the resist material was then removed using acetone by conventional lift-off techniques. The sample was placed on a carbon slab in a container which was filled with hydrogen gas. The carbon slab was then heated to 420 degrees C. at a rate of 400 degrees C. per minute. When the temperature of 420 degrees C. was reached, it was maintained for approximately 15 seconds and the resistive heating was immediately terminated. The sample was then removed 5 minutes later.

The GaAs FET was completed as described in Niehaus et al supra. (This additional processing includes etching the N-GaAs region to produce the final GaAs active region and to create a pad composed of 0.2 μm N+ GaAs on top of 0.2 μm of N GaAs.) The substrate was then processed to form individual devices as described in L. A. D'Asaro et al. (See D'Asaro, *IEEE Transactions on Electron Devices*, ED 25 (10), 1218 (1978).) The devices obtained were bonded into standard microwave packages. The package was secured to a heat sink. Thirty volts were applied between the source and drain, the gate voltage was adjusted to obtain a source drain current of 100 mA/mm of device width, and the current flowing between the source and drain was monitored. The time period taken to produce a failure in the device as indicated by infinite current or zero current was noted. The time for half of 16 devices made by the above-described technique to fail was approximately 600 hours. A short-term stability test was also performed by adjusting the gate voltage to yield a source-drain current at 100 mA/mm of device width and increasing the source-drain bias until device failure occurred. The ten devices failed in the range of 35-40 volts.

EXAMPLE 2

Devices were prepared, as described in Example 2, except an annealing temperature reaching 500 degrees C. was utilized. When the carbon plate used during the annealing processing reached 500 degrees C., the heating current was immediately terminated. The microwave devices were prepared and tested as described in the previous example. A median failure time between 0 and 10 hours was observed at 30 volts bias. The average short-term bias failure point was in the range 25-30 volts. The use of 30 volts bias is needed for an accelerated lifetime test. The actual lifetimes under normal operating voltages and the corresponding generated temperatures may not be exactly proportional to the lifetimes obtained in these accelerated tests. However, they are indicative of the lifetimes achieved and the widely different results in the 30 volts bias aging test obtained between the inventive process of Example 1 and that of Example 2.

EXAMPLE 3

A device was prepared, as described in Example 1, except that the boats were heated in reverse order so that the Au layer was deposited first, the Ag layer second, and the Au/Ge third. These devices within experimental error yielded approximately the same accelerated lifetime results as obtained in Example 1.

EXAMPLE 4

The process of Example 1 was followed except that the Au/Ge layer thickness was limited to 10 Å by decreasing the evaporation rate to 1 Å per second and continuing evaporation for approximately 10 seconds. Again, within experimental error the same results as obtained in Example 1 were achieved.

EXAMPLE 5

The process of Example 1 was followed except that the composition of the initial metallization was changed. This change was done by first heating boat 3 to produce a 100 Å thick layer of Au followed by heating boat 2 to produce a 1000 Å thick layer of Ag, followed by the heating of boat 1 to produce a 400 Å thick layer of Ag/Ge. This procedure was followed by the heating of boat 3 again to produce a 1000 Å thick layer of Au. (This fourth layer was added to bring the Au/Ag ratio into the appropriate range so as to render the contact chemically inert.) Again the same results within experimental error as achieved in Example 1 were demonstrated.

EXAMPLE 6

The process of Example 1 was followed except that initially during the device fabrication process, the N+ layer between the deposited metals and the N GaAs active region was omitted. The surface of the GaAs active region was etched to produce N pads having a thickness of about 0.4 μm. Short-term source drain voltage burnout occurred at 35 volts, which is comparable to the result for the device of Example 1.

EXAMPLE 7

A device was processed as described in Example 2 except that the process steps needed to produce the pad were omitted. Voltage burnout was measured as described in Example 1. Burnout for the device of Example 7 was at 12 volts as compared to 25 to 35 volts for the device of Example 2.

I claim:

1. A process for producing an electrical contact to a GaAs active region of a transistor semiconductor device comprising the steps of depositing a metal body onto a semiconductor which is ultimately formed into a pad, said semiconductor pad being in intimate contact with said GaAs active region, and annealing said metal composition at an elevated temperature CHARAC- TERIZED IN THAT said pad is up to 0.5 μm thick and said temperature and the composition of said metal body is controlled to prevent formation of metallic dendrites that extend into said GaAs active region.

2. The process of claim 1 wherein said temperature is in the range 400 degrees C. to 450 degrees C.

3. The process of claim 2 wherein said temperature is in the range 400 degrees C. to 420 degrees C.

4. The process of claim 1 wherein said metal body comprises three sequentially deposited layers.

5. A process for producing an electrical contact to a GaAs active region of a transistor semiconductor device comprising the steps of depositing a metal body onto a semiconductor which is ultimately formed into a pad, said semiconductor pad being in intimate contact with said GaAs active region, and annealing said metal composition at an elevated temperature CHARACTERIZED IN THAT said temperature and the composition of said metal body is controlled to prevent formation of metallic dendrites that extend into said GaAs active region wherein said metallic body comprises a layer of Au/Ge composition, a layer of Ag, and a layer of Au.

6. A process for producing an electrical contact to a GaAs active region of a transistor semiconductor device comprising the steps of depositing a metal body onto a semiconductor which is ultimately formed into a pad, said semiconductor pad being in intimate contact with said GaAs active region, and annealing said metal composition at an elevated temperature CHARACTERIZED IN THAT said temperature and the composition of said metal body is controlled to prevent formation of metallic dendrites that extend into said GaAs active region wherein said metallic body comprises a layer of Au, a layer of Ag, and a layer of Au/Ge composition.

* * * * *

UNITED STATES PATENT AND TRADEMARK OFFICE
CERTIFICATE OF CORRECTION

PATENT NO. : 4,301,188

DATED : November 17, 1981

INVENTOR(S) : William C. Niehaus

It is certified that error appears in the above—identified patent and that said Letters Patent is hereby corrected as shown below:

Column 2, line 65, "ae" should read --are--. Column 5, line 12, "heaed" should read --heated--.

Signed and Sealed this

Twenty-first Day of September 1982

[SEAL]

Attest:

Attesting Officer

GERALD J. MOSSINGHOFF

Commissioner of Patents and Trademarks